United States Patent [19]

Squire

[11] Patent Number: 4,891,587

[45] Date of Patent: Jan. 2, 1990

[54] MAGNETIC FIELD SENSOR USING VARIATIONS IN ULTRASOUND TO DETERMINE MAGNETIC FIELD

[75] Inventor: Patrick T. Squire, Bradford-on-Avon, England

[73] Assignee: National Research Development Corporation, London, England

[21] Appl. No.: 267,618

[22] Filed: Nov. 3, 1988

Related U.S. Application Data

[63] Continuation of Ser. No. 102,328, Sep. 29, 1987, abandoned.

[30] Foreign Application Priority Data

Sep. 30, 1986 [GB] United Kingdom ................ 8623435

[51] Int. Cl.$^4$ .............................................. G01R 33/02
[52] U.S. Cl. ...................................... 324/244; 324/260
[58] Field of Search ................. 324/244, 260; 333/148

[56] References Cited

U.S. PATENT DOCUMENTS 4,371,838 2/1983 Griscom ......................... 324/260 X

FOREIGN PATENT DOCUMENTS 0700846 11/1979 U.S.S.R. ............................... 324/244
0855563 8/1981 U.S.S.R. ............................... 324/260
1126906 11/1984 U.S.S.R. ............................... 324/260
1319119 12/1975 United Kingdom .

OTHER PUBLICATIONS

Robbins, W. P.; "Measurement ... Using Magnetoelastic Rayliegh-Wave Convolution"; *Journal of Applied Physics*, vol. 47, No. 11, pp. 5116-5120, Nov. 1976.
Koo et al; Characteristics of Fiber-Optic Magnetic Field Sensors Employing Metallic Glasses, *Optics Letters*, vol. 7, No. 7, pp. 334-336, Jul. 1982.

*Primary Examiner*—Gerard R. Strecker
*Attorney, Agent, or Firm*—Cushman, Darby & Cushman

[57] ABSTRACT

A magnetic field sensor including a body of amorphous magnetic material [C] and means to propagate ultrasound [A.B.D.] in said body together with means [E,F; PD, PSD, F] to detect variation with ambient magnetic field strength in the effect of the body on the propagation of ultrasound therein. The ultrasound is propagated as zero-mode shear wave, said mode being controlled by having the thickness of the body of amorphous magnetic material below a critical value which is the quotient of velocity divided by frequency. A specific magnetic field [G,J; G,M] can be applied to control the operating point of the sensor. The field can be alternating and the effect on propagation detected by a phase detector followed by a phase sensitive detector.

15 Claims, 3 Drawing Sheets

$$\phi = 2\pi L/\lambda \qquad (1)$$

$$\lambda = c/f \qquad (2)$$

$$c = (\mu/\rho)^{1/2} \qquad (3)$$

$$\Delta\phi = 2\pi L \Delta H \frac{\partial}{\partial H} \frac{1}{\lambda} + \frac{2\pi \Delta H}{\lambda} \frac{\partial L}{\partial H} \qquad (4)$$

$$\Delta\phi = \frac{\pi L f}{c} \left\{ \frac{1}{\mu} \frac{\partial \mu}{\partial H} \right\} \Delta H \qquad (5)$$

$$d = c/f \qquad (6)$$

Fig. 5

MAGNETIC FIELD SENSOR USING VARIATIONS IN ULTRASOUND TO DETERMINE MAGNETIC FIELD

This is a continuation of application Ser. No. 07/102,328, filed Sept. 29, 1987, which was abandoned upon the filing hereof.

This invention relates to a device to detect a magnetic field, whether steady or changing, and in particular to detect relatively small field strengths and small changes in field strength.

Several types of device to detect magnetic fields are known or proposed already and these have used a wide range of techniques. Some, such as that based on a superconducting Josephson junction (SQUID), are very sensitive but have awkward needs, such as liquid helium or other cryogenic coolant. Others have less sensitivity but are simpler and more robust. These include optically pumped systems, the Fluxgate and Induction Coil devices and Proton Procession magnetometers. A fibre-optic interferometer has been proposed (A. Yariv and H.V. Winsor, Proposal for detection of magnetic fields through magnetostrictive perturbation of Optical fibres, Optics letters, Vol. 5, No. 3, pp 87–89 1980) based on bonding one fibre-optic arm of the interferometer to a magneto-strictive element which element when strained by a change in magnetic field strength transfers the strain to the fibre to cause a phase shift in the optical transmission path through the fibre. So far this proposal has not yielded all the results hoped for, nor has any of the other techniques tried.

There is still a need for a relatively simple, robust and sensitive sensor.

It is an object of this invention to provide a magnetic field sensor with a performance which overcomes the shortcomings of earlier proposals.

According to the invention there is provided a magnetic field sensor including a body of magnetoelastic metallic glass material of defined thickness, transmitter means to propagate ultrasound in said body as a zero-mode shear wave, the mode being controlled by having the thickness of the body of amorphous magnetic material below a critical value which is the quotient of velocity divided by frequency, and receiver means to respond to ultrasound propagated through said body together with phase difference means to detect ambient magnetic field strength by the effect of the field on the propagation of ultrasound in said body.

The ultrasound is conveniently propagated using a radio frequency generator and a transmitter transducer, and may be over a wide range of frequencies, at least 0.1 MHz to 100 MHz. A receiving transducer may also be provided. The transducers may be piezoelectric devices. The transducers may be held to the glass by rigid adhesive. The transducers may be spaced along the body.

The sensor may include means to apply a specific magnetic field to the body. The specific magnetic field may be of steady or variable magnitude. The variation may be regular, as with a field generated by an alternating current. The variation may be dependent on a required or perceived operating state of the sensor. The specific magnetic field may be arranged to bias the operating point of the sensor. The sensor may be operated in a closed-loop, in such an arrangement the means to apply a specific magnetic field may be responsive to a control signal and include means to derive the control signal from the phase difference means, which control signal indicates the ambient magnetic field strength.

The phase difference means may include a phase meter. When the sensor includes means to apply a regularly variable specific magnetic field the phase difference means may include a phase detector responsive to the output of a rceiver transducer that produces an output $\phi$ indicative of phase difference and a phase sensitive detector responsive to the output of the phase detector which produces an output indicative of amplitude of the phase difference.

Amplitude as well as phase may be used to detect variation. One suitable detector is a high frequency lock-in amplifier with a vector phase option.

Embodiments of the invention will now be described with reference to the accompanying drawings in which:

FIG. 5 shows equations useful in understanding the invention.

Figure 1:
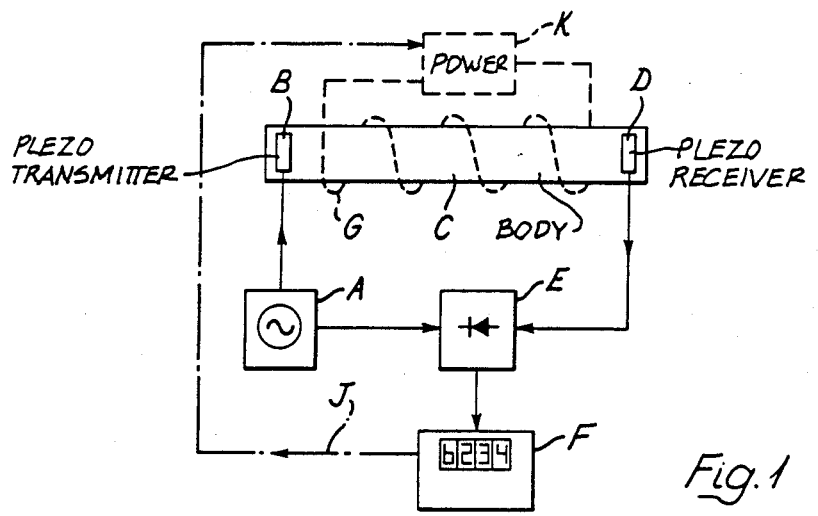
FIG. 1 shows in outline form a sensor embodying the invention.

Referring to FIG. 1 reference C indicate a strip or ribbon of amorphous magnetic material. This may be a metallic glass or other suitable material. Such material has a property which is made use of in the sensor to achieve a direct response to an ambient magnetic field which can be detected by propagating ultrasound through the material. This direct response simplifies the construction of the device and avoids some of the problems of the prior art where mechanical linking of elements is needed to make a response to a magnetic field a measurable effect.

Also in distinction from the earlier proposals the property that is used as the response to the magnetic field is not magnetostriction but magnetoelasticity.

Thus instead of the mechanical movement of the body of material having to be sensed the change in a physical property of the material is sensed directly by detecting the effect on propagation of ultrasound in the material of the change in shear modulus.

To this end a piezoelectric transmitter transducer, B, and a piezoelectric receiver transducer, D, are attached to the ends of the ribbon C. The transducers are attached to the metallic glass of the ribbon C by a rigid adhesive to ensure transmission of the shear wave. This arrangement is not conventional for launching shear waves.

The transmitter transducer B is energisable to propagate ultrasound by a source of frequency A. This is conveniently a radio-frequency generator. For test purposes a wide-range generator is appropriate (0.1 MHz to 100 MHz). In a sensor for a specific purpose a more limited range, or a fixed frequency, may be sufficient. The generator must provide adequate power to drive the transducer. Also the output of the generator must be stable in frequency and amplitude, particularly as phase measurements will be made.

The ultra sound is propagated as shear-waves, as discussed below.

The receiver/detector E, connected to receiving transducer D is used to measure phase differenes from the frequency of the source A resulting from passage of the ultrasound through the material to thereby detect the effect of the ambient magnetic field. Again for test purposes it may be useful to be able to measure amplitude as well. High sensitivity to phase change is needed for measurement of small field strengths or variations. A suitable receiver/detector is a high frequency lock-in amplifier with phase option (Model 9412A by Brookdeal).

A device was made as generally described above based on a strip of VAC 4040 from Vacuumschmelze in the as-received state. The strip was 20 millimeters wide and 25 micrometres thick. The transducers, of PZT5, were bonded to the strip 200 millimetres apart using cyanoacrylate adhesive.

Figure 2:
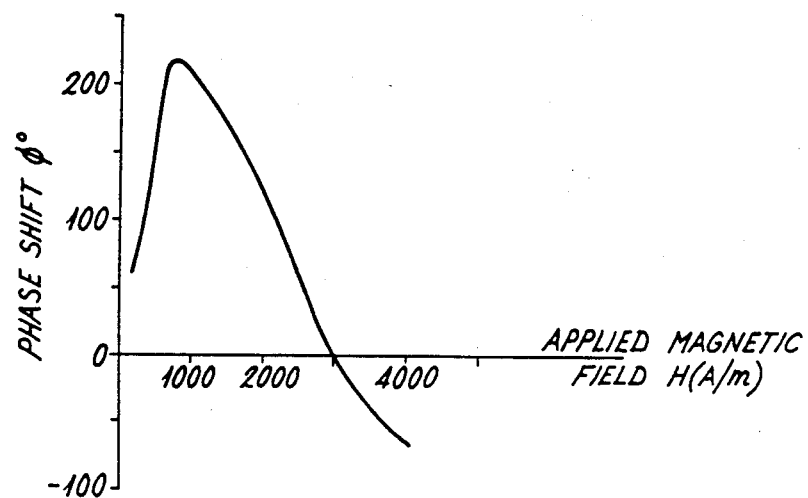
FIG. 2 shows the results of a test of the sensor of FIG. 1.

In one test using this strip and transducers at 900 KHz the phase shift with applied magnetic field was as shown in FIG. 2.

An output device F converts the phase-difference measured by unit E to a value of magnetic field strength or change for display or other use. If processing or corrections of the received signal are required for any reason, e.g. external temperature or motion of the sensor, these can be dealt with in units E and/or F.

For test purposes a long solenoid, shown in dotted line at G, can be energised by power unit K to apply a uniform, variable magnetic field to the strip. In actual operation such a solenoid can also provide a nulling method of operation. In this a d.c. signal J is applied to control the field around the strip or ribbon to maintain the phase difference constant. The control of signal J would be derived from units E and/or F and the signal would also be used to provide the output indication. In this way the sensor could be operated at maximum sensitivity, or some other preferred operating point, and an inherent non-linearity in the relationship between phase difference and applied field would be unimportant.

Figure 3:
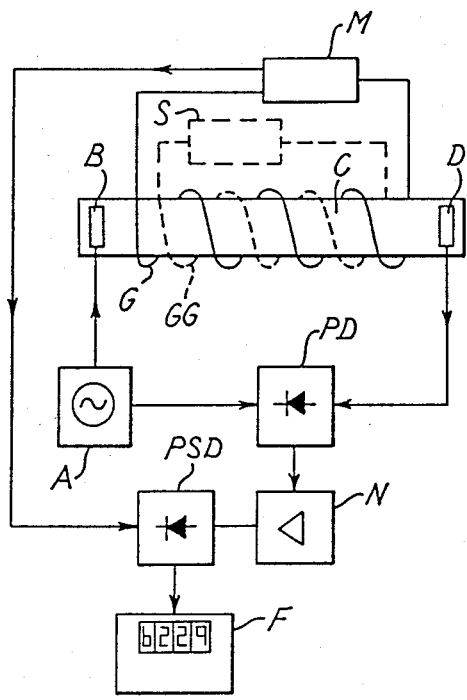
FIG. 3 shows in outline form another sensor embodying the invention.

FIG. 3 shows another sensor using the general arrangement of FIG. 1 with modifications to the control of the operating point to reduce the "noise" level resulting from, amongst other reasons, thermal and mechanical disturbances of the ribbon C. The sensitivity can again be controlled in this modified arrangement.

As shown in FIG. 3 the strip C has transducers B and D bonded to it and is of the same general form as in FIG. 1. The strip is of VAC4040 in the as-received state and is about 20 millimeters wide and about 30 micrometers thick. The transducers are again of PZT5 and about 250 millimeters apart. Each is $13 \times 2 \times 0.5$ millimeters in size and poled along the length. The bonding of the transducers to the face of the ribbon is by silver-loaded epoxy. Silver-loaded epoxy is also used to form the top electrode and top lead of each transducer.

A solenoid G is again used around strip C. The magnetic field from solenoid G is now varied at a suitable frequency by being energised by a low-frequency source M. The effect of so-energising the solenoid G is to produce a modulating field at frequency $f_M$ in the solenoid surrounding the strip C.

The result of applying the modulating field is to phase modulate the output from the receiving transducer D. This output is thus at frequency $f_M$ and its harmonics. In place of the phase detector E described above phase detector of a double balanced mixer PD (e.g. Plessey type SL1640) is used. The output signal from transducer D is large enough to be connected directly to the double balanced mixer. Ultrasound is propagated through the strip by radio frequency energy from source A. The amplitude of the fundamental component of the output of the phase detector PD is measured by a phase-sensitive detector PSD, after amplification in amplifier N. A d.c. bias field can be provided by source S and solenoid GG, or in any other suitable way, if required. The output of the phase-sensitive detector is displayed and/or recorded on a suitable device F, which may be a chart recorder.

The amplitude measured by the phase-sensitive detector PSD indicates the magnitude of an ambient, external field, incident on the strip, which is to be measured. This external field displaces the position of the modulating field on the phase/field characteristic to enable the measurement.

The arrangement can be operated in an open-loop mode, as shown in FIG. 3. In this mode the ambient, external, field must not exceed the quasi-linear region of the phase-field characteristic.

The arrangement can be operated in a closed-loop mode, similar to that described for FIG. 1. Here however the loop is closed by feeding back the amplified output of detector PSD with a phase to maintain the operating point close to the field zero of the phase/field characteristic. The feedback signal then indicates the ambient field.

Experiments with varying values of modulating field strength, $H_M$, at constant values of modulating frequency, $f_M$, and vice versa, indicate likely optimum operating conditions for the arrangement described with reference to FIG. 3. Over a range of $H_M$ of 4A/m to 33A/m maximum sensitivity is found at about 8A/m. At higher values the quasi-linear region is extended but the sensitivity is reduced. Over a range of $f_M$ of 233Hz to 1238Hz a drop in sensitivity is found above about 1000 Hz. Above about 1000 Hz a.c. losses cause appreciable hysteresis and a drop in sensitivity. "Noise" tends to decrease with frequency so an operating optimum around 1000 Hz is indicated.

Figure 4:
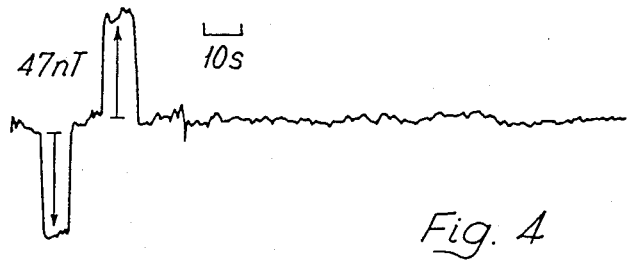
FIG. 4 shows the results of a test of the sensor in FIG. 3.

FIG. 4 shows a chart recording of output against time for the closed-loop mode (with the time constant of the phase sensitive detector output at 100 milliseconds). The vertical axis is nanoteslas and the horizontal one seconds. Scales for 47 nanoteslas and 10 seconds are shown. The 47 nanotesla value is a step in the ambient field, applied as a calibration action. The noise level shown is about 2.5 nanoteslas at a band width of about 1.6 Hz. A drift of similar amount in the three minute recording is also shown. The radio frequency energy is at about 1.8 MHz, at which frequency the transducers B and D described for FIG. 3 resonate, at an input amplitude of about 10 volts peak-to-peak giving an output amplitude of about 80 millivolts peak-to-peak. The dominant mode of the ultrasound is estimated to propagate at about 2.6 kilometers/second.

In another variation a form of compensated connection for two strips is used. The strips are arranged at right angles to each other and are used so that one has the field applied along its axis, the other then being perpendicular to the applied field. This arrangement permits compensation for temperature variations of the elastic modulus.

In a further variation two receiving transducers are placed at opposite ends of a strip having a single energising transducer at the centre. Such an arrangement can measure magnetic field gradients.

Reference is now directed to FIG. 5 where equations useful in understanding the invention are set out.

The phase difference, phi, between points on a wave a distance L apart for a wave having a wavelength, lambda, is given in Equation 1. Equation 2 relates frequency f and wave velocity c with wavelength. Equation 3 refers to the wave velocity of zero-order shear waves in a solid of density, rho, whose shear modulus is mu.

If a shear wave is propagated along a strip of amorphous magnetic material both the length and the shear modulus are functions of an applied magnetic field. The change in phase difference with magnetic field strength H is shown in Equation 4. The second term is the magnetostriction effect. This can be shown to be small compared to the first term which represents the magnetoelastic effect.

From Equations 2 to 4, to a good approximation, is derived Equation 5 in which the quantity in brackets represents the fractional change in shear modulus per unit applied field. Data for Young's Modulus now published (S. W. Meeks and J. C. Hill, Piezo magnetic and elastic properties of metallic glass alloys, $Fe_{67}Co_{18}B_{14}Si_1$ and $Fe_{18}B_{13.5}Si_{3.5}C_2$, J.Appl.Phy. Vol. 54, pp6584–6593, (1983)) suggests 0.05 per ampere/meter, as a practical figure. At a frequency of 20 MHz and a velocity of 2.5 kilometres/second the phase change will be about 1250 radians per metre per ampere/metre. The noise in the system is likely to limit the sensitivity and thus the field sensitivity but if a phase sensitivity in the range of 10 to 100 micro radians is assumed the field sensitivity is in the range of 0.01 to 0.1 microampere/metre or the equivalent flux density in air of 0.01 to 0.1 picoteslas per meter of active material (i.e. ribbon length). This is a very satisfactory sensitivity in terms of available sensors.

The above is based on the assumption that the acoustic wave propagating along the strip is a well-defined single mode. This is not always the case in bulk solids. However, suitable geometry can achieve some control. In particular a long strip below a certain critical thickness can favour the propagation of the zero-order shear wave mode and not the higher modes. Equation 6 gives the critical thickness, d, with c and f as above. For typical solids the velocity is about 3 km/s so at 3 MHz the critical thickness is 1 millimeter. Amorphous magnetic materials are generally in ribbons of thickness 25 micrometers, giving a frequency range up to 100 MHz. Phase shift is proportional to frequency but attenuation may reduce the apparent benefit of the higher frequencies for operation.

The techniques described provide a sensor of magnetic fields and field changes of a sensitivity of about one to one-tenth picotesla or less in air by the direct action of the field on the value of a physical property which is measured by direct methods.

I claim:

1. A magnetic field sensor comprising:
   a body of magneto-elastic metallic glass material of a defined thickness;
   transmitter means coupled to said body, for propagating ultrasound in said body as a zero-mode shear wave;
   said mode being controlled by having said thickness of the body below a critical value which is a quotient of velocity of the ultrasound in said body divided by frequency;
   means, magnetically coupled to said body, for applying a specific magnetic field to the body, to bias an operating point of the sensor;
   receiver means, coupled to said body, for responding to ultrasound propagated through said body; and
   phase difference means, coupled to said receiver means and responsive to said ultrasound detected thereby for determining an ambient magnetic field strength by detecting an effect of the magnetic field on the propagation of ultrasound in said body.

2. A sensor according to claim 1, in which the means to propagate ultrasound includes a radio frequency generator and a transmitter transducer.

3. A sensor according to claim 1, in which the means to propagate ultrasound has an effective range of frequencies of at least 0.1 MHz to 100 MHz.

4. A sensor according to claim 1, in which the transducers are piezoelectric and further comprising a rigid adhesive for holding the transducers to the body.

5. A sensor according to claim 1 including transducers spaced along the body.

6. A sensor according to claim 1 wherein said applied field magnitude is one of steady and variable.

7. A sensor according to claim 6 in which the variation is regular.

8. A sensor according to claim 7 further comprising means for generating the field by the application of an alternating current.

9. A sensor according to claim 6, in which the field is applied in dependence on a required or perceived operating state of the sensor.

10. A sensor according to claim 9, for operation in a closed-loop in which the means for applying a specific magnetic field is responsive to a control signal and includes means to derive said control signal from the phase difference means, which control signal indicates an ambient magnetic field strength.

11. A sensor according to claim 1, in which the phase difference means includes a phase meter.

12. A sensor according to claim 7, in which the phase difference means includes a phase detector responsive to the output of a receiver transducer and a phase sensitive detector responsive to the output of the phase detector.

13. A sensor according to claim 9, in which the phase difference means is also responsive to amplitude variation.

14. A sensor according to claim 9 in which the detector is a high frequency lock-in amplifier with a phase option.

15. A method of sensing a magnetic field comprising the steps of:
   supporting a body of magnetoelastic metallic glass material of defined thickness for exposure to a field to be sensed;
   propagating ultrasound in said body;
   controlling the propagation to be a zero-mode shear wave by maintaining a critical value which is the quotient of ultrasound velocity divided by frequency greater than said thickness;
   applying a specific magnetic field to the body to bias an operating point thereof;
   detecting a phase difference between an original frequency of the ultrasound and a frequency of the ultrasound after passing said body; and
   using said phase difference to determine ambient magnetic field strength by detecting the effect of the propagation of ultrasound in said body biased by said magnetic field.

* * * * *